United States Patent [19]

Raabe

[11] 4,250,514
[45] Feb. 10, 1981

[54] CAPACITANCE DIODE WITH PARTICULAR DOPING PROFILE

[75] Inventor: Gerhard Raabe, Hamburg, Fed. Rep. of Germany

[73] Assignee: U.S. Philips Corporation, New York, N.Y.

[21] Appl. No.: 59,828

[22] Filed: Jul. 23, 1979

[30] Foreign Application Priority Data

Jul. 29, 1978 [DE] Fed. Rep. of Germany ....... 2833318

[51] Int. Cl.$^3$ ............................................. H01L 29/92
[52] U.S. Cl. ...................................... 357/14; 357/51; 357/90
[58] Field of Search .............................. 357/14, 51, 90

[56] References Cited

U.S. PATENT DOCUMENTS

| 3,906,539 | 9/1975 | Sauermann et al. ................... 357/14 |
| 4,106,953 | 8/1978 | Onondera .............................. 357/14 |

FOREIGN PATENT DOCUMENTS 797439 10/1968 Canada ..................................... 357/14

*Primary Examiner*—Joseph E. Clawson, Jr.

*Attorney, Agent, or Firm*—Thomas A. Briody; Robert T. Mayer; Steven R. Biren

[57] ABSTRACT

A capacitance diode includes an epitaxial layer of a first conductivity type provided on a substrate in which a doping profile is formed in the epitaxial layer by controlled doping during the epitaxial layer growth, and a surface zone of the second conductivity type which forms a p-n junction with the epitaxial layer. According to the invention, the doping profile in the epitaxial layer varies according to the equation $$N(x) = k \cdot \frac{\left[ \ln \frac{x}{x_0} \right]^n}{x^\beta}$$

wherein x is the distance from the p-n junction in $\mu$m, $x_o$ is the width of the barrier layer in $\mu$m at a voltage $-U_D$ across the p-n junction, $U_D$ is the diffusion voltage of the p-n junction, and k, n and $\beta$ are constants. As a result of this doping profile, a very low frequency deviation is obtained which does not change sign.

1 Claim, 5 Drawing Figures

CAPACITANCE DIODE WITH PARTICULAR DOPING PROFILE

BACKGROUND OF THE INVENTION

The invention relates to a capacitance diode having a semiconductor body with an epitaxial layer of a first conductivity type in which a doping profile is formed by controlled doping during growth, and a surface zone of the second conductivity type in the epitaxial layer which forms a p-n junction with the first-mentioned zone.

When such capacitance diodes are used as tuning capacitances in parallel oscillatory circuits, the resonance curve of the oscillatory circuit is distorted due to the nonlinear characteristic of the diode.

This effect is described in "Valvo Berichte", part VII, No. 2, pp. 97–107, (in particular pp. 99–101). From this article it appears that upon driving the capacitance diode a deviation about the resonant frequency f of $\Delta f/f$ occurs in the oscillatory circuit for a voltage variation $\Delta U$ across the diode.

In a prior art capacitance diode this disturbing frequency deviation assumes comparatively large and—which is particularly disturbing—both positive and negative values.

SUMMARY OF THE INVENTION

One of the objects of the invention is to construct a capacitance diode of the kind mentioned in the opening paragraph in such manner that the frequency deviation in the driving range of the diode becomes as small as possible and does not change sign.

According to the invention, the doping profile of the epitaxial layer from the p-n junction varies according to the equation $$N(x) = k \cdot \frac{\left[\ln \frac{x}{x_o}\right]^n}{x^\beta}$$

between the limits $N_o$ and $N_E$, the ratio of $N_o$ to $N_E$ being adapted to the desired capacitance swing, in which x is the distance in μm from the p-n junction, $x_o$ is the width of the barrier layer in μm at the p-n junction at the voltage $-U_D$, $U_D$ being the diffusion voltage of the p-n junction, $N_o$ is the doping concentration at the p-n junction in at.cm$^{-3}$, $N_E$ is the starting doping concentration of the epitaxial layer in at.cm$^{-3}$, k is a constant value between $5.10^{14}$ and $1.10^{17}$, n is a constant integer between 0 and 6, and $\beta$ has a constant value between 1 and 2.

With this doping profile, the frequenc deviation in the driving range of the diode is reduced, and does not change sign.

It is to be noted that the doping profile is deemed to satisfy the given equation when for given values of $N_o$, $N_E$, k, n and: $\beta$ $$k \frac{\left[\ln \frac{x}{x_o'}\right]^n}{x^\beta} \leq N(x) \leq k \frac{\left[\ln \frac{x}{x_o''}\right]^n}{x^\beta}$$

wherein $x_o'$ is the value of $x_o$ calculated by choosing instead of $N_o$ the value 0.90 $N_o$ and instead of $N_E$ the value 0.98 $N_E$, while $x_o''$ is found by choosing instead of $N_o$ the value 1.10 $N_o$ and instead of $N_E$ the value 1.02 $N_E$ in calculating $x_o$ as a function of $N_o$ and $N_E$.

BRIEF DESCRIPTION OF THE DRAWING

The invention will now be described in greater detail, by way of example, with reference to the accompanying drawings, in which.

DETAILED DESCRIPTION

Figure 1:
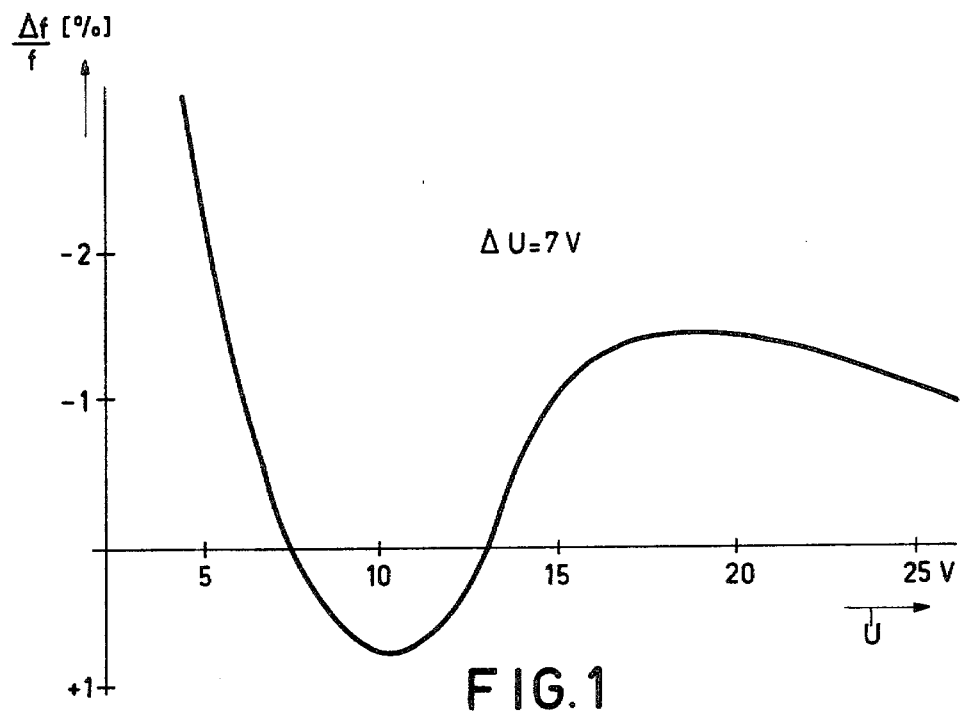
FIG. 1 shows the variation of the frequency deviation as a function of the applied voltage in a prior art capacitance diode.
Figure 2:
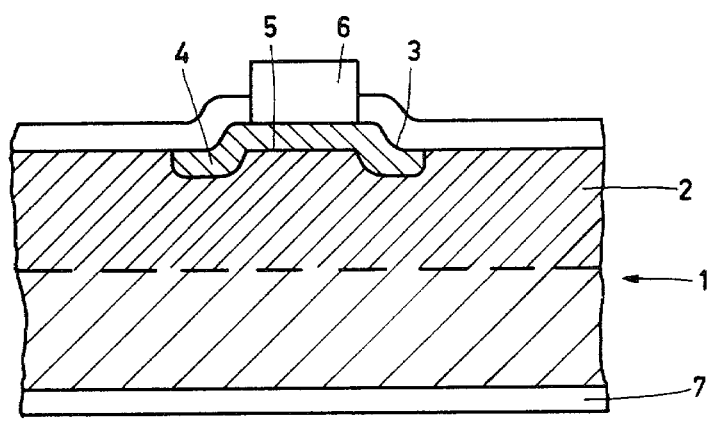
FIG. 2 is a cross-sectional view of a capacitance diode according to the invention.

FIG. 2 is a sectional view of a capacitance diode of the kind described. The semiconductor body 1 consists of an n-type silicon substrate having a resistivity of approximately $2.10^{-3}$ ohm.cm. An epitaxial layer is grown on this substrate, the doping during the growth being controlled so that, starting from a doping concentration $N_E = 2.2.10^{15}$ at.cm$^{-3}$, the doping profile, at least from approximately x=0.3 μm to approximately x=2 μm, varies according to the equation $$N = k \cdot \frac{\left[\ln \frac{x}{x_o}\right]^n}{x^\beta}$$

wherein
$x_o$ is 0.1 μm at $-U_D = 860$ mV
n=1
$\beta=2$ and
k=$2.03.10^{15}$.

In the grown epitaxial layer doped in this manner, which layer has a thickness of 4.8 μm, after etching the mesa 3 in a height of 0.7 μm, the p-type zone 4 is then provided from the surface over an area of $8.2.10^{-4}$ cm$^2$ by diffusion of boron in a surface concentration of $4.10^{20}$ at.cm$^{-3}$ down to a depth of 0.6 μm. The doping concentration $N_o$ at the p-n junction 5 then is $1.97.10^{17}$ at.cm$^{-3}$.

The capacitance diode thus manufactured is then contacted by providing metal layers 6 and 7 and is provided in a suitable envelope.

Figure 3:
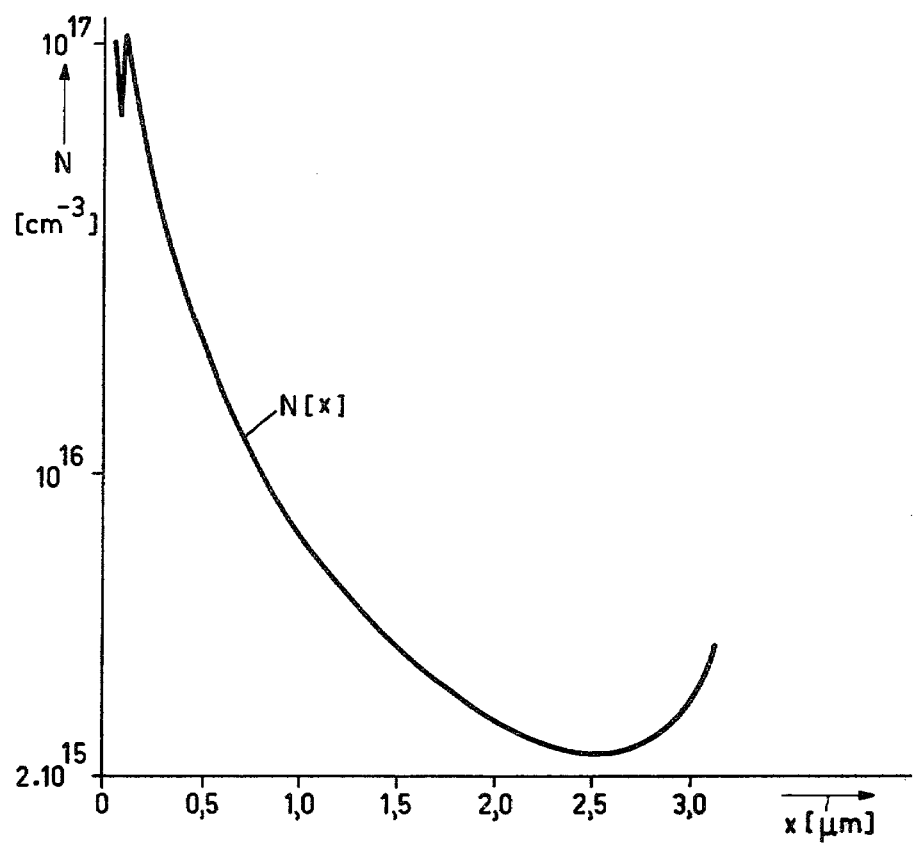
FIG. 3 shows the variation of the doping profile of the capacitance diode shown in FIG. 2.

FIG. 3 shows the measured variation of the doping profile between the p-n junction 5 and the substrate of the capacitance diode shown in FIG. 2.

Figure 4:
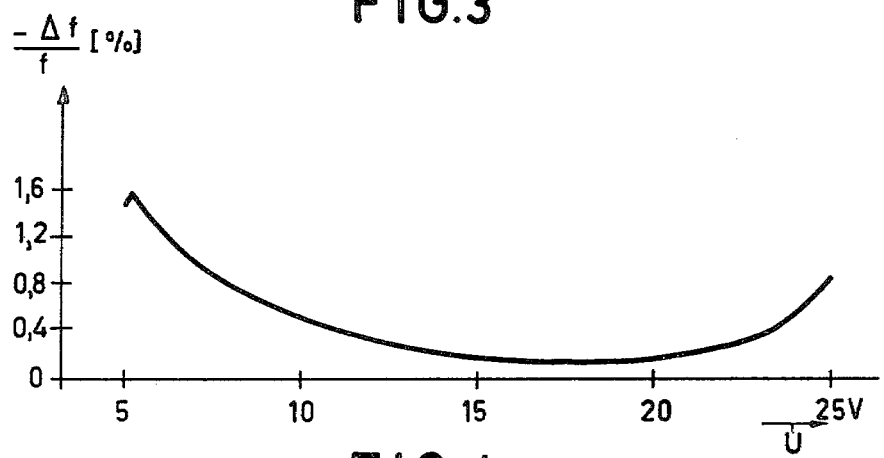
FIG. 4 shows the variation of the frequency deviation in a capacitance diode shown in FIGS. 2 and 3.

With this variation of the doping profile, the variation of the frequency deviation shown in FIG. 4 is obtained, from which it appears that in a diode proportioned in this manner the frequency deviation has only one sign (the deviation remains negative) and the value of the deviation within the practical driving limits of the diode does not exceed a value of 0.5%.

The increase of the value of the frequency deviation at higher voltages appearing from the curve shown in FIG. 4 could in principle be avoided but is to be ascribed to the increase of the doping profile, as is shown in FIG. 3, as a result of the doping of the substrate which must be chosen to be rather high so as to give the capacitance diode a series resistance which is as low as possible.

Figure 5:
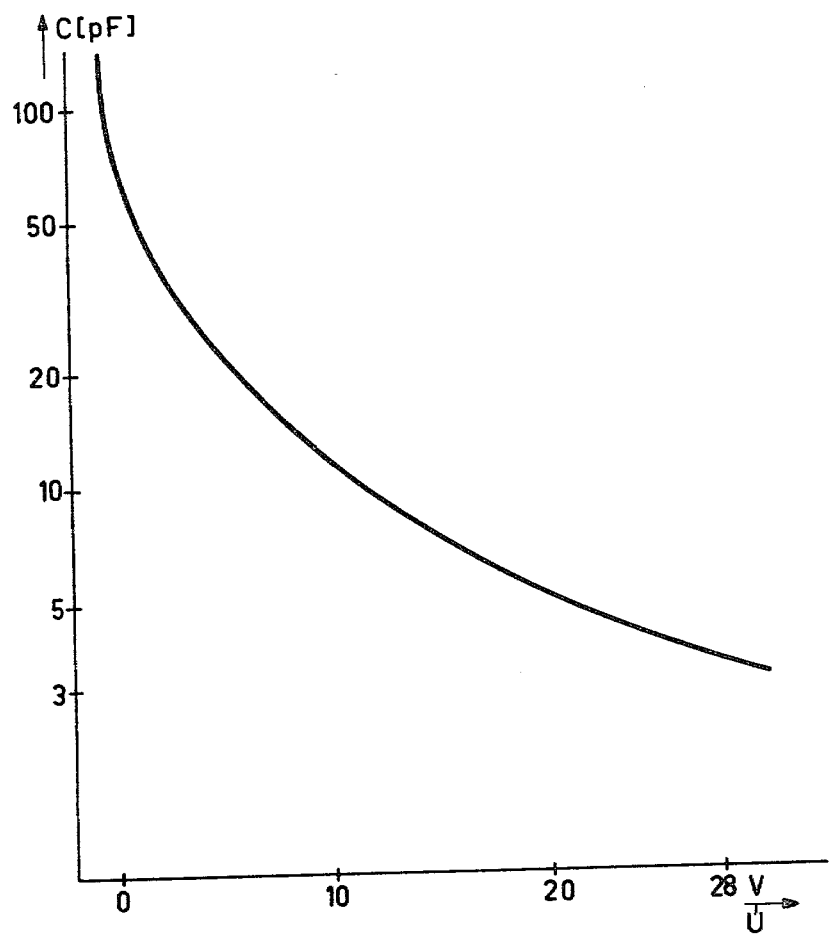
FIG. 5 shows the capacitance-voltage characteristic of the capacitance diode as shown in FIGS. 2 and 3.

FIG. 5 shows the capacitance-voltage characteristic of a capacitance diode shown in FIGS. 2 and 3. The doping profile can be derived from the variation of such a characteristic since an unambiguous relationship exists between the two curves. Starting from the basic equations (see, for example, "Solid State Electronics" 20 (1977) pp. 485-490, in particular p. 485):

$$N(x) = -\frac{C^3}{q \epsilon \epsilon_0 A^2} \cdot \frac{dU}{dC} \quad \text{and} \quad (1)$$

$$\ = \frac{\epsilon_0 A}{C} \quad (2)$$

wherein $N(x)$ = doping concentration at the distance $x$ from the p-n junction
C = capacitance of the p-n junction
U = voltage at the p-n junction
q = electron charge
$\epsilon\epsilon_0$ = dielectric constant of the semiconductor material, and
A = surface area of the p-n junction. From equations (1) and (2) it follows by integration:

$$\int_{-U_D}^{U} \frac{\epsilon\epsilon_0}{q} dU = \int_0^x N(x) \cdot x \, dx \quad (3)$$

wherein $U_D$ is the diffusion voltage of the p-n junction. By elaborating for a given doping profile $N(x)$ the C-U characteristic can be constructed for this profile from (2) and (3). For example, by starting respectively from the above given lowermost and uppermost tolerance limits for $N(x)$, two C-U characteristics can be obtained for given values of $N_o$ and $N_E$. If the measured C-U characteristics lie within these limit curves, the conditions of the invention are satisfied.

The invention may also be applied to capacitance diodes having a geometry other than that according to the examples. The conductivity types may also be reversed and semiconductor materials other than silicon, for example germanium or gallium arsenide, may also be used.

What is claimed is:

1. A capacitance diode having a semiconductor body with an epitaxial layer of a first conductivity type provided on a substrate, in which a doping profile is formed in the epitaxial layer by controlled doping during the epitaxial layer growth, and a surface zone of the second conductivity type in the epitaxial layer which forms a p-n junction with said layer, characterized in that the doping profile varies according to the equation $$N(x) = k \cdot \frac{\left[\ln \frac{x}{x_0}\right]^n}{x^\beta}$$

between the limits $N_o$ and $N_E$, in which equation the ratio of $N_o$ to $N_E$ is adapted to the desired capacitance swing,
  x is the distance in $\mu$m from the p-n junction,
  $x_o$ is the width of the barrier layer in $\mu$m at the p-n junction at the voltage $-U_D$, where $U_D$ is the diffusion voltage of the p-n junction in volts,
  $N_o$ is the doping concentration at the p-n junction in at.cm$^{-3}$,
  $N_E$ is the starting doping concentration of the epitaxial layer in at.cm$^{-3}$,
  k is a constant value between $5.10^{14}$ and $1.10^{17}$,
  n is a constant integer between 0 and 6, and
  $\beta$ has a constant value between 1 and 2.

* * * * *

UNITED STATES PATENT AND TRADEMARK OFFICE
CERTIFICATE OF CORRECTION

PATENT NO. : 4,250,514
DATED : Feb. 10, 1981
INVENTOR(S) : Gerhard Raabe

It is certified that error appears in the above—identified patent and that said Letters Patent is hereby corrected as shown below:

Col. 2, first equation change " $\leqq$ " to -- $\leqq$ -- in both occurrences

Col. 3, Equation 3 "UD" should be -- $-U_D$ --

Claim 1, last line "βhas" should be --β has--

Signed and Sealed this

First Day of November 1983

[SEAL]

Attest:

GERALD J. MOSSINGHOFF

Attesting Officer      Commissioner of Patents and Trademarks